US007944757B2

(12) United States Patent
Moschiano et al.

(10) Patent No.: US 7,944,757 B2
(45) Date of Patent: May 17, 2011

(54) NON-VOLATILE MULTILEVEL MEMORY CELL PROGRAMMING

(75) Inventors: Violante Moschiano, Bacoli (IT); Giovanni Santin, Rieti (IT); Tommaso Vali, Sezze (IT); Massimo Rossini, Rome (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/718,290

(22) Filed: Mar. 5, 2010

(65) Prior Publication Data

US 2010/0165739 A1 Jul. 1, 2010

Related U.S. Application Data

(63) Continuation of application No. 12/038,445, filed on Feb. 27, 2008, now Pat. No. 7,692,971.

(30) Foreign Application Priority Data

Mar. 28, 2007 (IT) .............................. RM2007A0167

(51) Int. Cl.
*G11C 11/34* (2006.01)

(52) U.S. Cl. ......... 365/185.22; 365/185.18; 365/185.19; 365/185.25

(58) Field of Classification Search .............. 365/185.22, 365/185.18, 185.19, 185.25
See application file for complete search history.

(56) References Cited

U.S. PATENT DOCUMENTS

| 6,643,188 | B2 | 11/2003 | Tanaka et al. | |
|---|---|---|---|---|
| 6,671,207 | B1 | 12/2003 | Parker | |
| 6,778,442 | B1 * | 8/2004 | Hamilton et al. | ........ 365/185.28 |
| 6,888,758 | B1 | 5/2005 | Hemink et al. | |
| 6,937,518 | B1 | 8/2005 | Park | |
| 7,031,214 | B2 | 4/2006 | Tran | |
| 7,035,146 | B2 | 4/2006 | Hemink et al. | |
| 7,042,766 | B1 * | 5/2006 | Wang et al. | .............. 365/185.22 |
| 7,136,304 | B2 * | 11/2006 | Cohen et al. | ............. 365/185.19 |
| 2002/0154545 | A1 | 10/2002 | Tanaka et al. | |
| 2005/0162916 | A1 | 7/2005 | Guterman et al. | |
| 2006/0285392 | A1 | 12/2006 | Incarnati et al. | |

FOREIGN PATENT DOCUMENTS

EP 1 324 343 A2 7/2003

OTHER PUBLICATIONS

International Search Report and Written Opinion for related PCT Application PCT/US2008/004114, dated Jul. 29, 2008 (21 pgs.).

* cited by examiner

*Primary Examiner* — Son T Dinh
(74) *Attorney, Agent, or Firm* — Brooks, Cameron & Huebsch, PLLC.

(57) ABSTRACT

Embodiments of the present disclosure provide methods, devices, modules, and systems for programming multilevel non-volatile multilevel memory cells. One method includes increasing a threshold voltage (Vt) for each of a number of memory cells until the Vt reaches a verify voltage (VFY) corresponding to a program state among a number of program states. The method includes determining whether the Vt of each of the cells has reached a pre-verify voltage (PVFY) associated with the program state, selectively biasing bit lines coupled to those cells whose Vt has reached the PVFY, adjusting the PVFY to a different level, and selectively biasing bit lines coupled to cells whose Vt has reached the adjusted PVFY, wherein the PVFY and the adjusted PVFY are less than the VFY.

30 Claims, 7 Drawing Sheets

NON-VOLATILE MULTILEVEL MEMORY CELL PROGRAMMING

PRIORITY APPLICATION INFORMATION

This application is a Continuation of U.S. application Ser. No. 12/038,445, filed Feb. 27, 2008, which claims priority to Italian Patent Application Serial No. RM2007A000167 filed Mar. 28, 2007, the specifications of which are incorporated herein by reference.

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

The state of a memory cell, e.g., the data stored in the cell, is determined by the threshold voltage (Vt). As an example, in a SLC, a Vt of 0.5V can indicate a programmed cell while a Vt of −0.5V might indicate an erased cell. A MLC includes multiple Vt windows that can each indicate a different state.

In MLCs, it is important that the Vt distributions be sufficiently spaced apart so as to reduce the possibility of a higher voltage of one distribution overlapping a lower Vt of the next distribution. The overlap can occur due to factors such as noise, floating gate coupling, or temperature variations of the integrated circuit, among various other factors. One way to create larger gaps between the various Vt distributions is to make the distributions themselves narrower. This can be difficult because memory cells program at different rates, e.g., Vts increase at varying rates, due to factors such as manufacturing process variations and/or repeated programming and erasing, among other factors.

A fast cell can have a higher threshold voltage than a slow cell, for a given programming period. Therefore, faster memory cells may be programmed before the slower cells since the faster cells can require fewer programming pulses. This can result in the Vt distribution for the faster cells being different than the Vt distribution for slower cells and/or closer to other Vt distributions due to the wider Vt distributions that can be created by faster cells.

One method to improve the above problems caused varying Vt rates of fast and stow memory cells is illustrated in U.S. Pat. No. 6,643,188 to Tanaka et al. and assigned to Toshiba and SanDisk Corporation. Tanaka et al. disclose a two-step programming method that uses first and second step verify voltages. Once a Vt for a memory cell being programmed reaches the first step verify voltage, a write control voltage is changed for all cells being programmed. This method can slow down the programming of all the memory cells, which can reduce programming throughput. That is, reducing the programming speed of all of the cells being programmed increases the time it takes to program all of the cells, whether the cells are fast cells or slow cells.

Another method that may be used to create narrower Vt distributions is to adjust the programming pulse step voltage as the cell Vt approaches a programmed state. However, this also can reduce programming throughput by requiring more programming pulses, e.g., due to a smaller incremented pulse step, which can slow the programming for all of the cells.

For the reasons stated above, and for other reasons stated below, which will become apparent to those skilled in the art upon reading and understanding the present disclosure, it can be beneficial to generate narrow memory cell Vt distributions while maintaining adequate programming throughput of a memory device.

DETAILED DESCRIPTION

Figure 1:
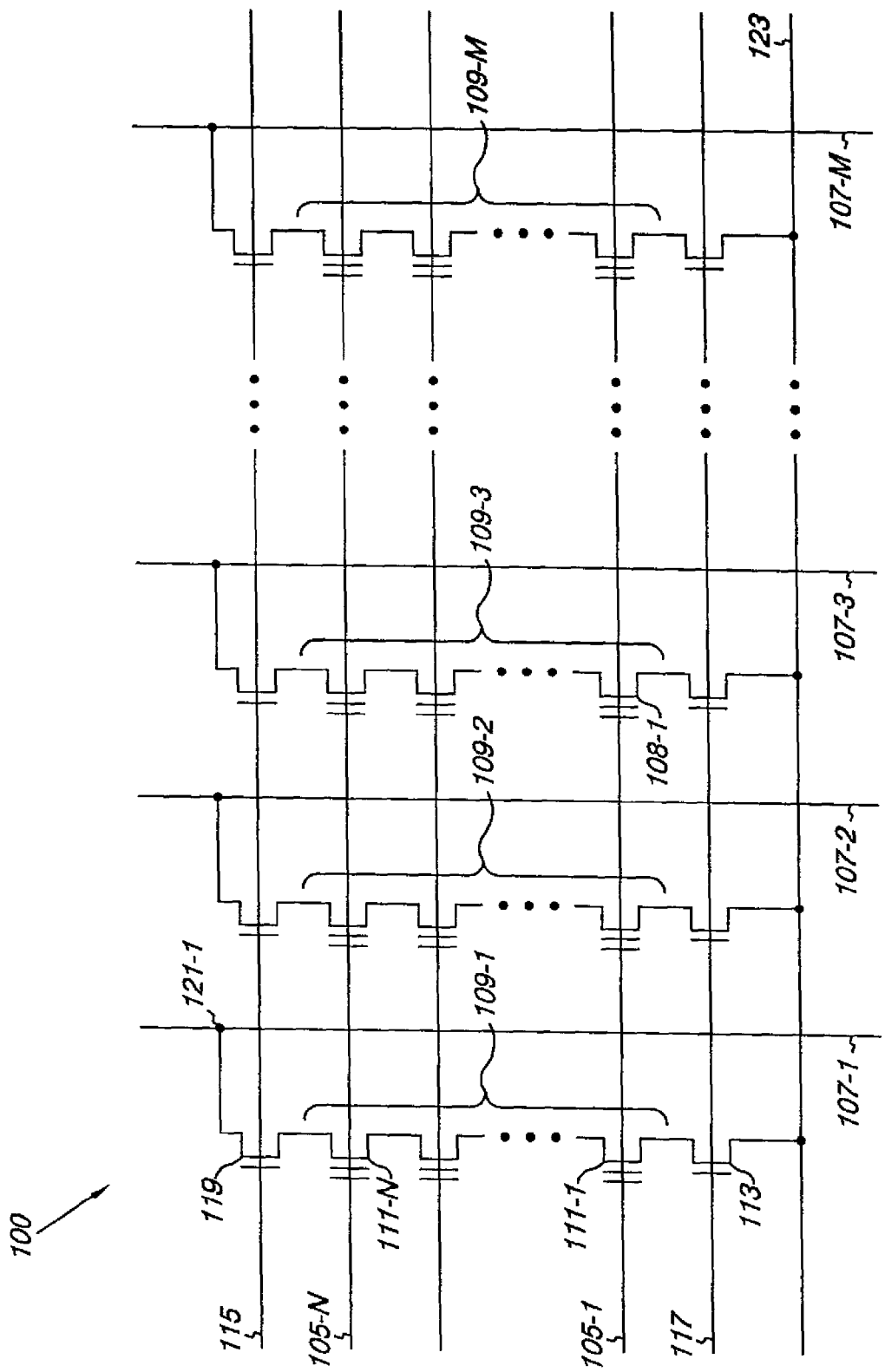
FIG. 1 is a schematic of a portion of a non-volatile memory array that can be programmed according to embodiments of the present disclosure.

Embodiments of the present disclosure provide methods, devices, modules, and systems for programming multilevel non-volatile multilevel memory cells. One method includes increasing a threshold voltage (Vt) for each of a number of memory cells until the Vt reaches a verify voltage (VFY) corresponding to a program state among a number of program states. The method includes determining whether the Vt of each of the cells has reached a pre-verify voltage (PVFY) associated with the program state, selectively biasing bit lines coupled to those cells whose Vt has reached the PVFY, adjusting the PVFY to a different level, and selectively biasing bit lines coupled to cells whose Vt has reached the adjusted PVFY, wherein the PVFY and the adjusted PVFY are less than the VFY.

In various embodiments, bit lines coupled to cells whose Vt has reached the PVFY or the adjusted PVFY are selectively biased with a voltage greater than a programming bit line voltage and less than an inhibit voltage. In such embodiments, selectively biasing the bit lines slows the programming rate, e.g., the cell Vt shift per programming pulse, of cells coupled to the bit lines until the cell reaches the VFY corresponding to a particular program state.

In various embodiments, the PVFY is incremented on a pulse by pulse basis until a particular threshold PVFY is reached. Adjusting the PVFY on a pulse by pulse basis in this manner can result in narrow Vt distributions by slowing the programming rate of fast cells more efficiently than prior programming methods, while improving programming throughput.

In various embodiments, a number of programming pulses are incremented by a step voltage from a first programming voltage to a threshold programming voltage. The threshold programming voltage can be an uppermost programming voltage. For those memory cells whose Vt has not reached the threshold PVFY prior to the programming voltage reaching the threshold programming voltage, the bit line voltage to be selectively applied to bit lines coupled to the cells in response to their Vt reaching the threshold PVFY can be modulated, e.g., decreased. In some embodiments, the bit line voltage is decremented after each of a number of programming pulses, subsequent to the first number of programming pulses, until the bit line voltage to be selectively applied to bit lines coupled to cells in response to their Vt reaching the threshold PVFY reaches the programming bit line voltage.

The bit line voltage to be selectively applied to bit lines coupled to cells in response to the Vt of the cells reaching the PVFY can be referred to as a selective slow programming convergence (SSPC) voltage. In various embodiments, the SSPC voltage is modulated only after the programming pulses have reached the uppermost programming pulse voltage. Modulating the SSPC voltage after a number of programming pulses at the uppermost voltage level can increase programming throughput by reducing and/or eliminating the effect of the SSPC voltage on slow cells, which reduces the number of subsequent programming pulses, e.g., reduces the time, for the slower cells to reach the VFY level once they have reached the PVFY level.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

FIG. 1 is a schematic of a portion of a non-volatile memory array 100 that can be programmed according to embodiments of the present disclosure. The embodiment shown in FIG. 1 illustrates a NAND architecture non-volatile memory. However, embodiments described herein are not limited to this example. As shown in FIG. 1, the memory array 100 includes word lines 105-1, . . . , 105-N and intersecting bit lines 107-1, . . . , 107-M. For ease of addressing in the digital environment, the number of word lines 105-1, . . . , 105-N and the number of bit lines 107-1, . . . , 107-M are each some power of two, e.g., 256 word lines by 4,096 bit lines.

Memory array 100 includes NAND strings 109-1, . . . , 109-M. Each NAND string includes non-volatile memory cells 111-1, . . . , 111-N, each located at an intersection of a word line 105-1, . . . , 105-N and a local bit line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SOD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 11'-N, e.g., floating-gate transistor, of the corresponding NAND string 109-1.

In various embodiments, construction of non-volatile memory cells, 111-1, . . . , 111-N, includes a source, a drain, a floating gate or charge storage layer, and a control gate. Non-volatile memory cells, 111-1, . . . , 111-N, have their control gates coupled to a word line, 105-1, . . . , 105-N, respectively. A column of the non-volatile memory cells, 111-1, . . . , 111-N, make up the NAND strings, e.g., 109-1, . . . , 109-M, coupled to a given local bit line, e.g., 107-1, . . . , 107-M, respectively. A row of the non-volatile memory cells are commonly coupled to a given word line, e.g., 105-1, . . . , 105-N. Embodiments of the present disclosure are not limited to a particular type of array architecture. For example, embodiments may also operate properly in NOR and/or AND architecture array. An AND array architecture would be similarly laid out except that the string of memory cells would be coupled in parallel between the select gates.

In operation, the word lines 105-1, . . . , 105-N select the individual floating gate memory cells 111-1, . . . , 111-N in the strings 109-1, . . . , 109-M to be written to or read from and operate the remaining, e.g., unselected, floating gate memory cells 111-1, . . . , 111-N in each string 109-1, . . . , 109-M in a pass through mode. During a prior art programming operation, the selected word line for the memory cell to be programmed is biased with a series of incrementing voltage programming pulses that start at an initial voltage that is greater than a predetermined programming voltage, e.g., approximately 16V. After each programming pulse, a verification operation with a word line voltage of 0V is performed to determine if the Vt of the cell has increased to the desired program level, e.g., 0.5V, 1.0V, 2.0V, among various other Vt levels that can correspond to a particular programmed state.

The unselected word lines for the remaining cells are typically biased at a voltage, e.g., a pass through voltage, that is less than the programming voltage, e.g., approximately 10V, during the program operation. The unselected word line voltage is not limited to a particular pass through voltage. The programming of the other memory cells occurs in a similar manner.

Figure 2:
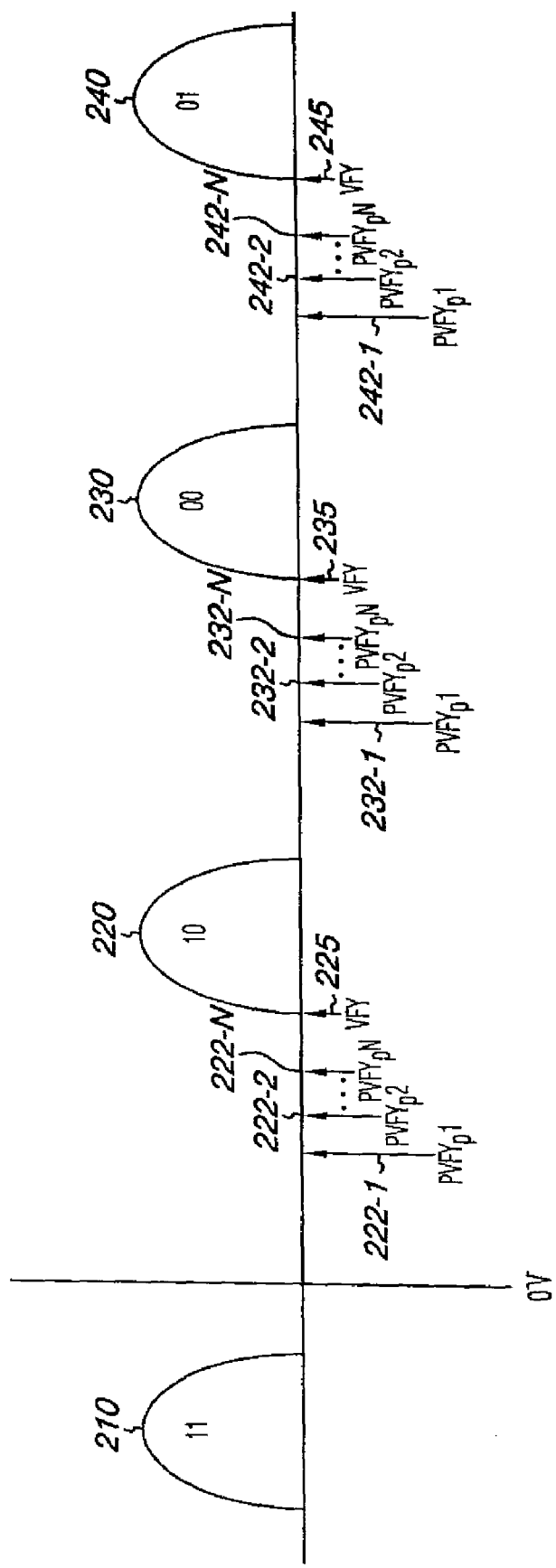
FIG. 2 illustrates a diagram of Vt distributions each having an associated verify voltage and a number of pre-verify voltages according to an embodiment of the present disclosure.

FIG. 2 illustrates a diagram of Vt distributions each having an associated verify voltage and a number of pre-verify voltages according to an embodiment of the present disclosure. FIG. 2 shows a number of Vt distributions 210, 220, 230, and 240. In this embodiment, the distribution 210 is at a negative Vt level and corresponds to an erased state "11." Vt distributions 220, 230, and 240 correspond to respective program states "10," "00," and "01," in the example shown in FIG. 2.

Each program distribution 220, 230, and 240 has an associated verify voltage (VFY) 225, 235, and 245. The VFY 225 indicates the Vt level above which a memory cell is considered to be programmed to the "10" state. The VFY 235 indicates the Vt level above which a memory cell is considered to be programmed to the "00" state. The VFY 245 indicates the Vt level above which a memory cell is considered to be programmed to the "01" state. As an example, VFY 225 can be 0.4V, VFY 235 can be 1.2V, and VFY 245 can be 2.2V.

In various embodiments of the present disclosure, and as shown in FIG. 2, each program state "10," "00," and "01" has a number of associated pre-verify voltage (PVFY) levels. That is, program state "10" has associated PVFY levels 222-1, 222-2, . . . , 222-N, program state "00" has associated PVFY levels 232-1, 232-2, . . . , 232-N, and program state "01" has associated PVFY levels 242-1, 242-2, . . . , 242-N.

In the embodiment shown in FIG. 2, each of the PVFY levels associated with a particular program state is less than the VFY level for that state, e.g., each of PVFY levels 222-1, 222-2, . . . , 222-N is less than VFY 225. In various embodiments, the uppermost PVFY level, e.g., 222-N, 232-N, 242-N, are about 0.1V to 0.3V below the respective VFY level, e.g., 225, 235, 245.

As described further below in connection with FIGS. 3 to 5, the rate at which the Vt of a cell being programmed increases can be slowed in response to the Vt reaching a PVFY level. That is, the bit line coupled to the cell can be biased with a voltage such that the Vt shift of the cell due to a subsequent programming pulse is reduced.

In various embodiments, and as described further below, the PVFY level can be adjusted, e.g., modulated, on a pulse by pulse basis after each of a number of programming pulses applied to a cell being programmed to a particular state, e.g., to a Vt level within one of distributions 220, 230, and 240. For instance, as shown in FIG. 2, each of the PVFY levels, e.g., 222-1, 222-2, . . . , 222-N, is increased after each of a number of programming pulses to an uppermost PVFY level, e.g., 222-N. That is, 222-1 (PVFYp1) is associated with a first programming pulse, 222-2 (PVFYp2) is associated with a second programming pulse subsequent to the first, and 222-N (PVFYpN) is associated with a programming pulse subsequent to the first and second pulses.

As one example, the PVFYp1 222-1, 232-1, 242-1 may be about 0.4V to 0.7V below the respective VFY 225, 235, 245. In this example, the PVFYp2 222-2, 232-2, 242-2 may be about 0.3V to 0.6V below the respective VFY 225, 235, 245. In some embodiments, the PVFY levels associated with each program state can be uniformly incremented on a pulse by pulse basis, e.g., the PVFY can be increased in 0.05V or 0.1V increments until the uppermost PVFY, e.g., PVFYpN, associated with the program state is reached. Embodiments are not so limited. For instance, in some embodiments, PVFY levels associated with subsequent programming pulses are increased by a smaller step size than PVFY levels associated with prior programming pulses, e.g., PVFYp2 can be 0.2V greater than PVFYp1, PVFYp3 can be 0.1V greater than PVFYp2, and PFVYp4 can be 0.05V greater than PVFYp3, etc.

Figure 4A:
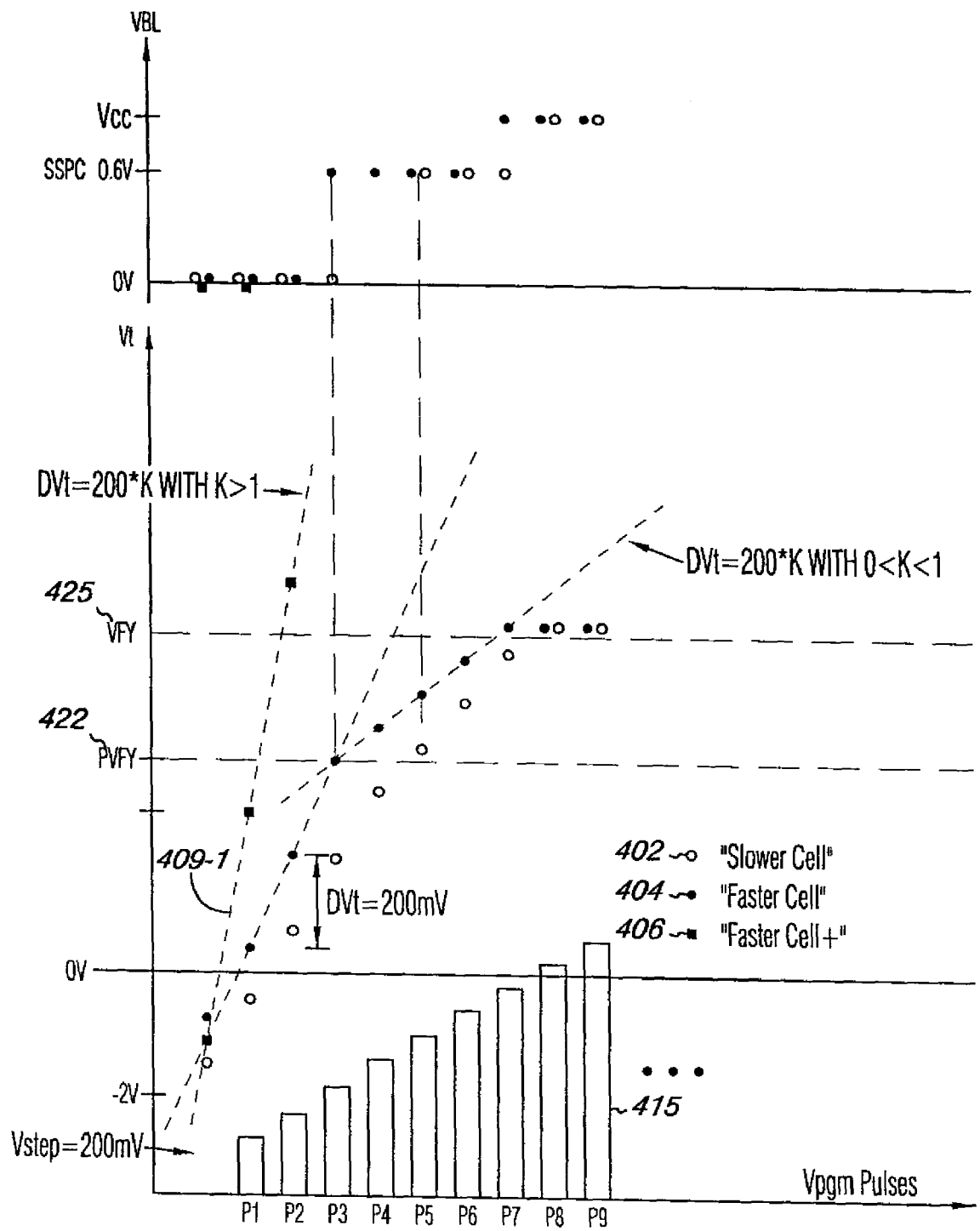
FIG. 4A illustrates a plot of programming pulses, memory cell Vt levels, and bit line voltages in accordance with a prior programming method.
Figure 4B:
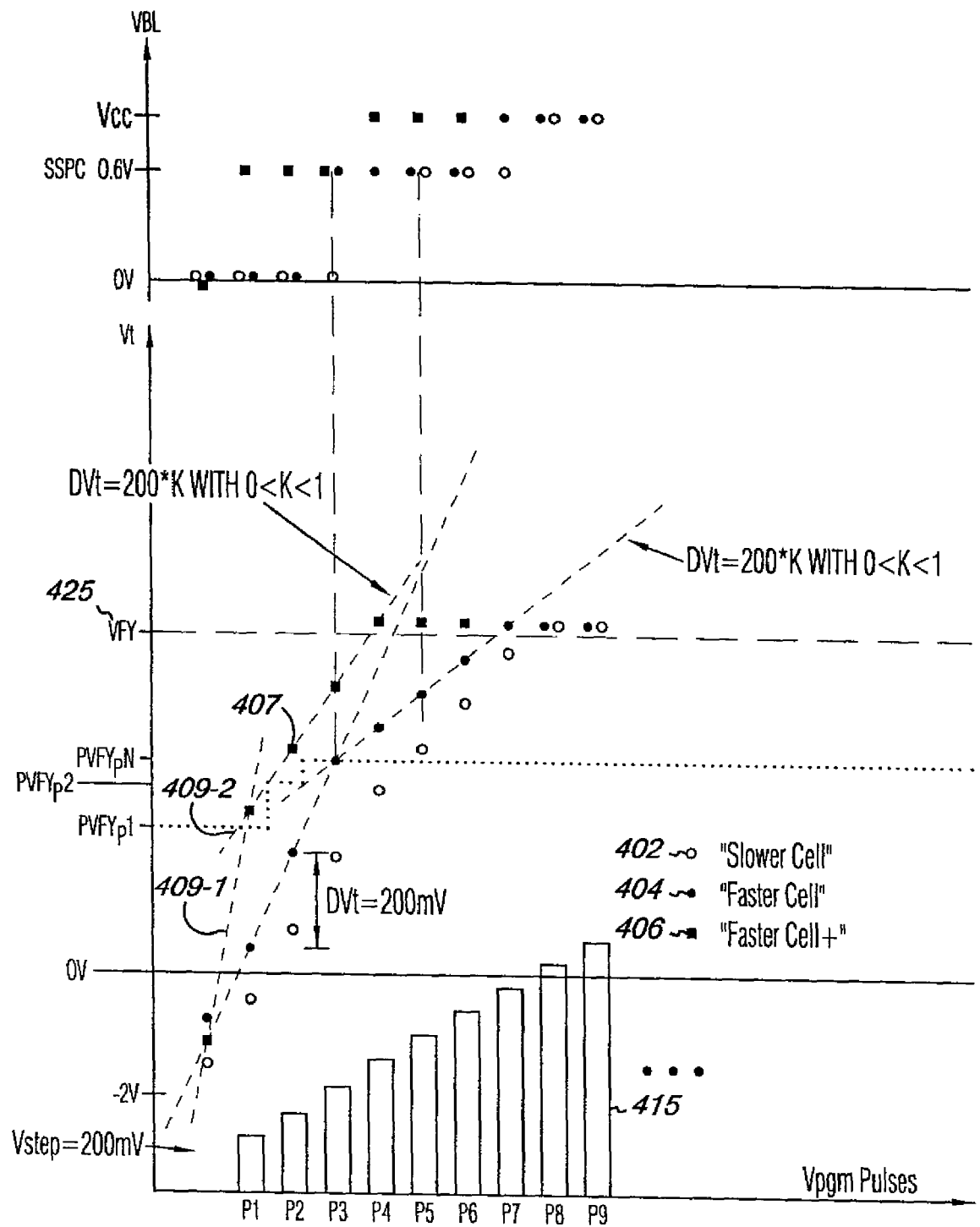
FIG. 4B illustrates a plot of programming pulses, memory cell Vt levels, and bit line voltages in accordance with the programming embodiment of FIG. 3.

As shown in FIG. 4B, adjusting the PVFY level associated with a particular program state, e.g., "10," "00," and "01," on a pulse by pulse basis can reduce and/or prevent fast cells, e.g., cells whose Vt shift between programming pulses is larger than a step voltage of the pulses, from being overprogrammed, e.g., from reaching a Vt level greater than the desired particular program state. Cells programmed to Vt levels greater than the desired state result in a wider Vt distribution for the state and/or can result in data read errors.

Embodiments are not limited to the example shown in the diagram of FIG. 2. For instance, various programming methods of the present disclosure may be used to program memory cells having more than the quantity of states, e.g., Vt distributions, shown. Also, embodiments are not related to the particular binary coding of a Vt distribution but generally to the transition from a generic Vt distribution to a different distribution having a higher Vt. For example, in some embodiments, the MLCs can have more than two bits thus necessitating additional distributions. Moreover, in some embodiments, each state may be mapped to a different location. For example, state "10" may be mapped to the higher Vt distribution, e.g., 240, and state "01" mapped to the lower Vt distribution, e.g., 220.

Figure 3:
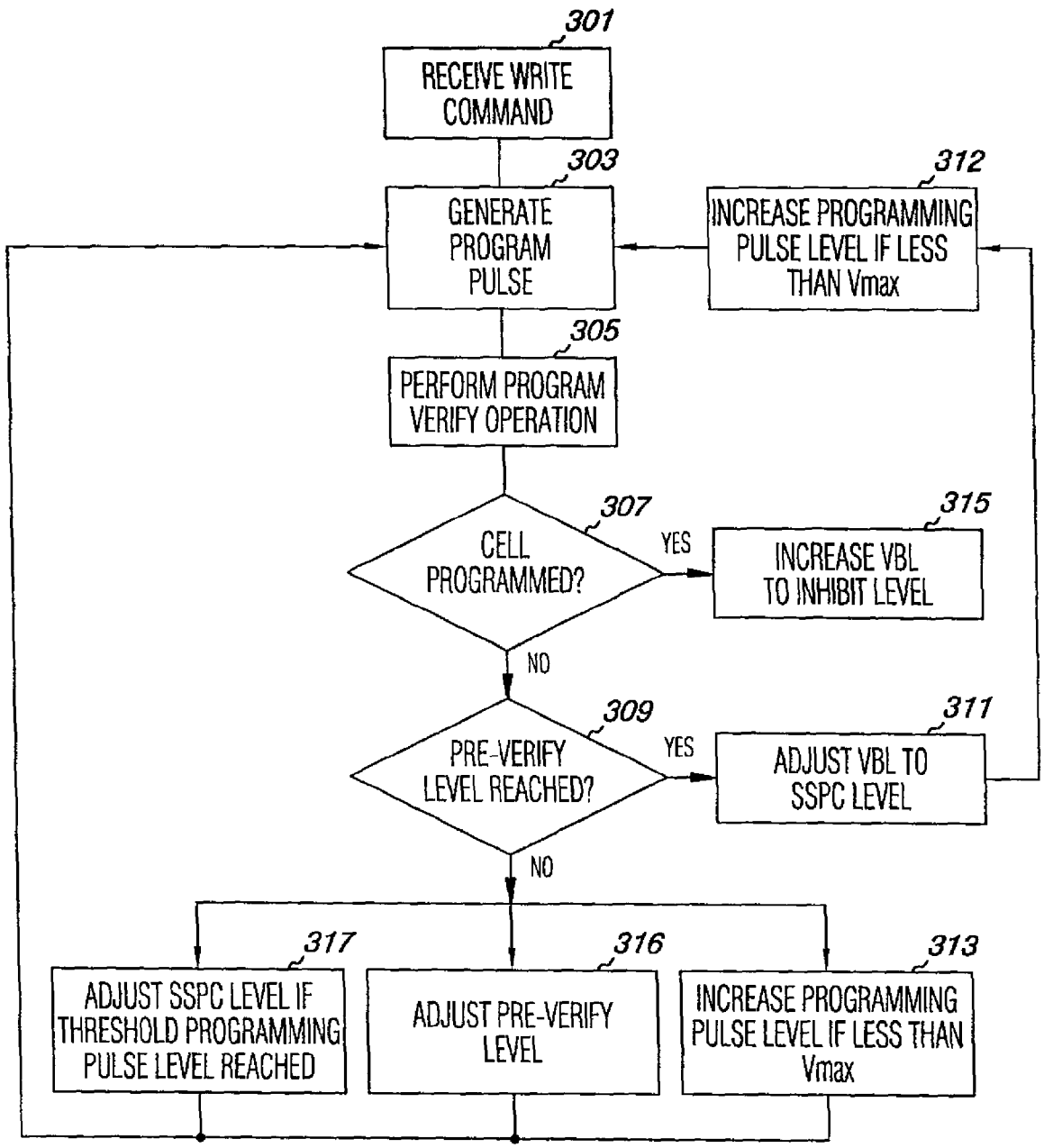
FIG. 3 illustrates a flowchart of a programming method according to an embodiment of the present disclosure.

FIG. 3 illustrates a flowchart of a programming method according to an embodiment of the present disclosure. In the embodiment illustrated in FIG. 3, the programming method is a modulated selective slow programming convergence method. An example of a selective slow programming convergence method is described in copending, commonly assigned U.S. patent application Ser. No. 11/414,982, entitled "Selective Slow Programming Convergence in a Flash Memory Device," filed on May 1, 2006, which is incorporated herein by reference.

At block 301, a command is received to write data to, e.g., to program, one or more memory cells. The data may be a single bit or multiple bits. At block 303, a programming pulse is generated and applied to the selected word line. A program verify operation is then performed 305 to determine if the cell has been properly programmed 307, e.g., to determine if the Vt of the cell has reached the corresponding VFY for the state. The verify operation is simply a read of the cell to determine its contents and a comparison of the read data with the desired data.

If the cell has been programmed to the proper state, e.g., the cell's Vt has reached the verify voltage associated with the proper state, its drain connection, i.e., the bit line to which the cell is connected, is biased at a program inhibit voltage 315. In various embodiments, the bit line voltage (VBL) is increased from a programming bit line voltage, e.g., 0V, used during programming to a supply voltage such as Vcc, e.g., 1V, 2V, or 3V, among various other bit line voltages that inhibit cells coupled thereto from being further programmed. That is, the VBL can be increased to various voltages that prevent the Vt of a memory cell coupled thereto from shifting further upward in response to subsequent programming pulses applied to the selected word line.

If the verify operation 305 determines that the cell is not yet programmed with the desired data 307, the Vt for the cell is checked 309 to determine if it has reached a first PVFY level, e.g., PVFYp1 222-1, 232-1, 242-2 as shown in FIG. 2, for that particular state. As described above in connection with FIG. 2, in various embodiments, each state can have number of associated PVFY levels, e.g., 222-1 to 222-N, 232-1 to 232-N, and 242-1 to 242-N shown in FIG. 2. In such embodiments, and as described in detail in connection with FIG. 4B, the PVFY is a modulated PVFY that is adjusted on a pulse by pulse basis. That is, the PVFY level to which the memory cell's Vt is compared, varies over a number of programming pulses. In other words, although the cell's Vt is compared against a particular PVFY, e.g., 222-1 to 222-N, 232-1 to 232-N, 242-1 to 242-N, after each programming pulse, the particular PVFY to which the cell's Vt is compared changes, e.g., increases, after each pulse until the uppermost PVFY, e.g., 222-N, 232-N, 242-N, is reached.

The PVFY level is a voltage less than the associated VFY level for each particular program state, e.g., each PVFY level 222-1 to 222-N, 232-2 to 232-N, and 242-2 to 242-N is less than the respective VFY level 225, 235, and 245 as shown in FIG. 2. In various embodiments, the PVFY level is the voltage at which programming of a particular cell is slowed down in response to the Vt for that particular cell reaching that PVFY level. That is, the bit line is biased with a voltage less than the inhibit voltage and greater than the programming bit line voltage such that the Vt of the particular cell increases at a slower rate for a number of subsequent programming pulses.

The biasing voltage to which bit lines are adjusted in response to a cell coupled thereto reaching the PVFY level, can be referred to as a selective slow programming convergence (SSPC) voltage. As shown at block 311 in the embodiment of FIG. 3, the bit line voltage VBL is adjusted to the SSPC level for cells that reach the PVFY level 309. As described further herein below, various values for the SSPC voltage can be used, e.g., 0.3V, 0.5V, 0.9V, among other voltage levels and/or ranges of levels that can be applied to a bit line to slow the programming rate of a memory cell. The biasing of the bit line reduces the voltage drop across the memory cell transistor, thus reducing the effective programming voltage applied to the cell. The lower the effective programming voltage, the slower the movement of the Vt for that cell. In various embodiments, and as described in connection with FIGS. 5A-5B, the SSPC voltage can be a modulated SSPC voltage which may be decreased over a number of programming pulses.

Unlike some prior programming methods, various method embodiments of the present disclosure selectively slow the programming of each cell that has passed a modulated pre-verify threshold voltage for the particular state being programmed into the cell. Other cells being programmed are unaffected by SSPC bit line biasing and are allowed to be programmed at their normal programming speed. Therefore, the modulated selective slow programming method described in the embodiment of FIG. 2 can have the effect of narrowing the Vt distributions associated with particular program states without reducing the programming throughput.

Figure 5A:
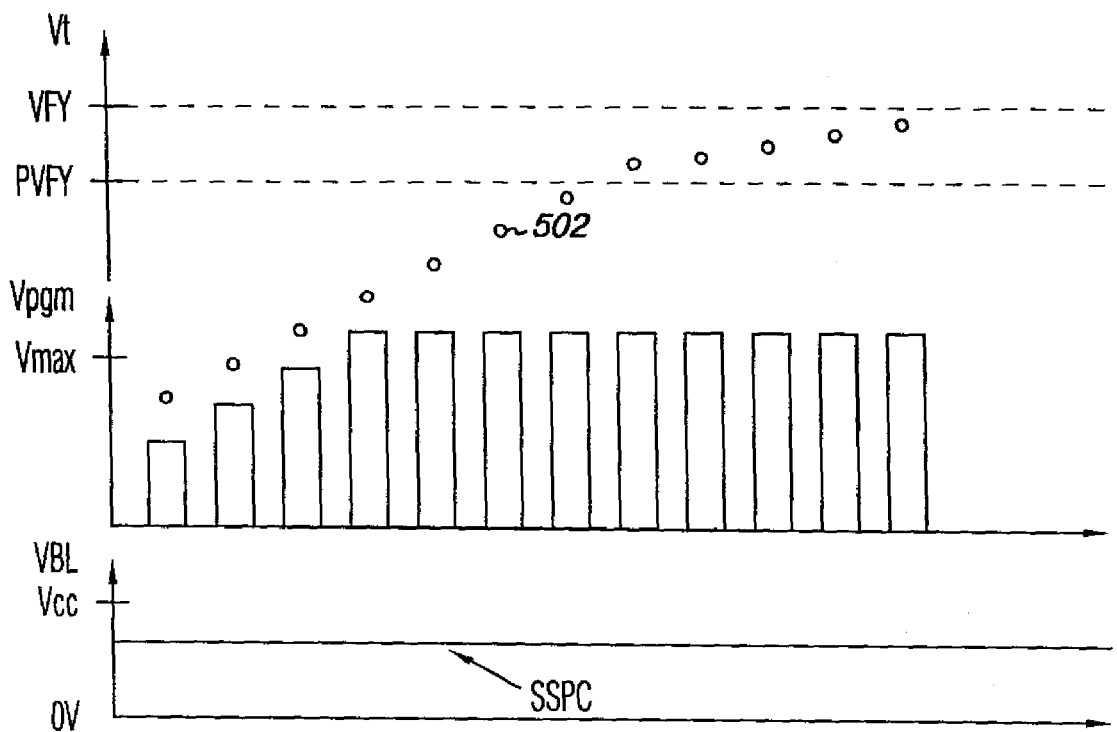
FIG. 5A illustrates a plot of programming pulses, memory cell Vt levels, and bit line voltages in accordance with a selective slow programming convergence method.
Figure 5B:
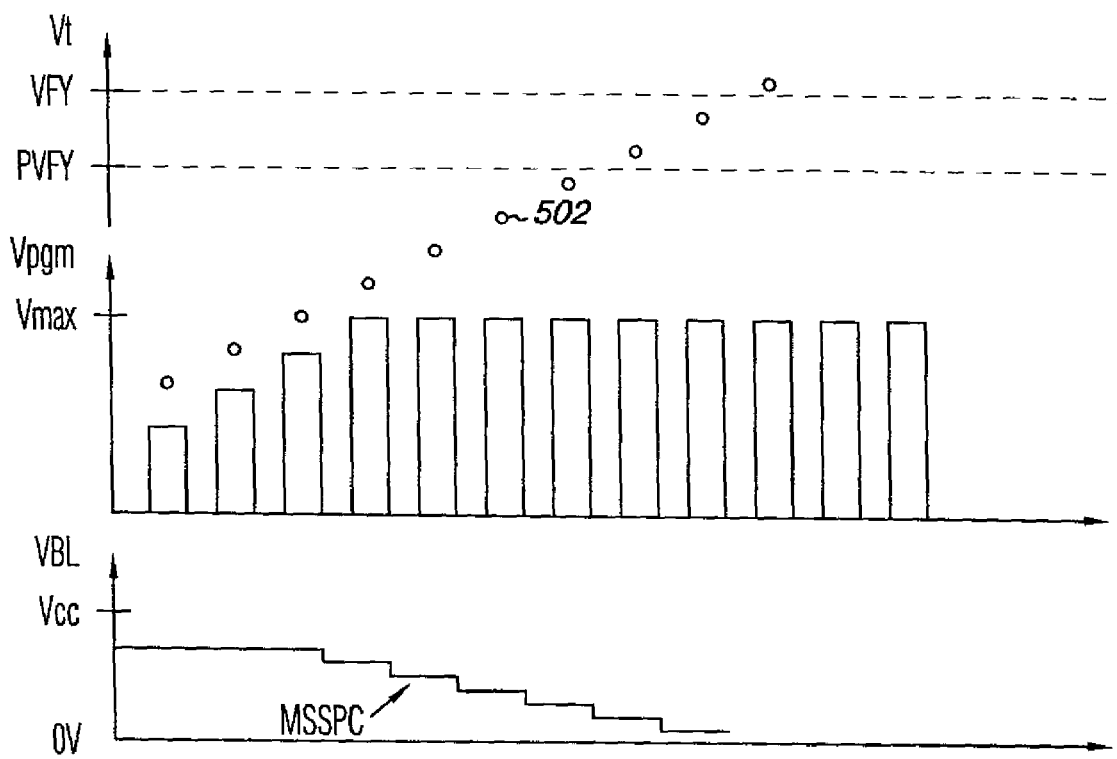
FIG. 5B illustrates a plot of programming pulses, memory cell Vt levels, and bit line voltages in accordance with the programming embodiment of FIG. 3.

Also, using a modulated PVFY in various modulated selective slow programming method embodiments can prevent fast cells, e.g., cells having Vts which increase by larger voltage step than the programming pulse step voltage, from becoming overprogrammed and/or widening a Vt distribution. As shown in FIGS. 5A-5B, modulating, e.g., decreasing, the SSPC voltage when an uppermost programming pulse voltage is reached, can improve throughput by reducing the number of pulses necessary to shift the Vts of slower cells to the VFY level once the slower cells have reached the PVFY level.

After the bit line voltage VBL has been increased, e.g., adjusted to the SSPC level 311, the programming process repeats by generating another programming pulse 303. In various embodiments and as shown at block 312, subsequent programming pulses are incrementally larger than the previous pulse up to an uppermost programming pulse voltage level (Vmax). The uppermost programming voltage level can be about 20V-22V, however, embodiments are not limited to a particular Vmax. In one embodiment, the programming pulses are increased by a 0.2V step voltage. This step voltage is for purposes of illustration only as embodiments of the present invention can use various step voltages to increase the programming pulse levels, e.g., 0.1V, 0.3V, 0.5V, among other step voltages.

The voltage drop across the memory cell transistor is reduced clue to the VBL increase 311. Therefore, the increased programming pulse voltage 312 will have a reduced effect on programming the cell. That is, the Vt shift of the cell due to the pulse is less than the Vt shift would have been in the absence of the SSPC voltage applied to the bit line, e.g., the cell's programming rate is slowed. The programming of the particular cell to the particular state continues until the cell is programmed, e.g., until the cell's Vt reaches the VFY level for the particular state, at which point the VBL is increased to the inhibit voltage 315 to prevent any further Vt increase of the cell due to subsequent programming pulses.

If the programming pulse generated at 303 does not result in the Vt of the cell reaching the pre-verify voltage level, e.g., PVFYp1 in this case, then the process continues at blocks 313, 316, and 317. The programming pulse voltage is increased 313 by the step voltage if the Vmax has not been reached. This subsequent programming pulse is applied to the selected cell's word line. As shown at block 316, the PVFY level is also adjusted, e.g., increased from PVFYp1 to PVFYp2 in this case. In various embodiments, the PVFY level is only increased if an uppermost PVFY, e.g., PVFYpN 222-N, 232-N, 242-N as shown in FIG. 2, has not been reached. That is, in various embodiments, the PVFY level remains at the uppermost PVFY level until a subsequent pulse causes the Vt of the cell to reach the uppermost PVFY level.

As shown at block 317, in various embodiments, the SSPC level is adjusted, e.g., modulated, if a threshold programming pulse level has been reached. In various embodiments, the threshold programming pulse level is the uppermost programming pulse voltage level, e.g., Vmax. As described further in connection with FIGS. 5A-5B, modulating, e.g., decreasing, the SSPC level can improve programming throughput of selective slow programming convergence for slower cells.

The modulated selective slow programming convergence process illustrated in FIG. 3 repeats until the pre-verify voltage level is reached 309 and the cell is eventually programmed 307 such that the bit line voltage VBL is increased to the inhibit voltage 315. The method illustrated in FIG. 3 can be performed on each cell, e.g., each bit, in a selective manner. For example, in various embodiments, instead of biasing the bit line of all cells when a cell's Vt has reached a pre-verify voltage, only as each cell's Vt reaches the pre-verify voltage is its particular bit line voltage increased, e.g., to the SSPC voltage, to slow the programming speed.

In a memory device using multi-level cells, the bits may be located in the same page address or in multiple page addresses. When the bits are in the same page address, both bits can be changed at the same time. In other words, a same page address programming process can go directly from the erased state of "11," e.g., distribution 210 shown in FIG. 2, to a programmed state of "00," e.g., distribution 230 shown in FIG. 2. If one or more of the multiple bits are in different page addresses, only one bit at a time is changed. For example, to go from the erased state of "11" to the programmed state of "00," it is typically necessary to go through either state "10" or state "01," depending upon where these states are mapped. The modulated selective slow programming convergence method embodiments of the present invention can operate to program bits located in the same page address or in multiple addresses.

FIG. 4A illustrates a plot of programming pulses, memory cell Vt levels, and bit line voltages in accordance with a prior programming method. FIG. 4B illustrates a plot of programming pulses, memory cell Vt levels, and bit line voltages in accordance with the programming embodiment of FIG. 3. The plot of FIG. 4B shows the memory cell Vt levels and bit line voltages illustrated in FIG. 4A as modified by the programming embodiment described in FIG. 3.

The lower plot illustrated in FIGS. 4A and 4B shows a number of programming pulses 415 with the voltage level of each pulse increasing by a step voltage, e.g., Vstep, along the bottom axis. The illustrated embodiment uses a Vstep of 200 mV. However, as described above, embodiments of the present disclosure are not limited to particular step voltage.

The plots shown in FIGS. 4A and 4B, include memory cells that program at different rates, e.g., cells whose Vts shift differently in response to programming pulses 415. Cell 402 represents a "slower cell" having a Vt that generally shifts by an amount equal to or less than the programming pulse step Vstep, e.g., 200 mV in this example. Cell 404 represents a "faster cell" having a Vt that generally shifts by an amount equal to or slightly greater than Vstep. Cell 406 represents a cell (shown as Faster Cell+) that has a Vt that shifts by an amount greater than Vstep in response to programming pulses 415. The upward movement of the cells 402, 404, and 406 represents an increasing Vt.

In FIGS. 4A and 4B, prior to the Vt reaching a PVFY level, the slower cell 402 is increasing by an amount DVt less than 200 mV, the faster cell 404 is increasing by an amount DVt about equal to 200 mV, and the cell 406 is increasing by an amount DVt greater than 200 mV. As a result, the Vt of cell 406 reaches the PVFY level before cell 404, which reaches the PVFY level before cell 402.

In various embodiments, and as shown in FIGS. 4A and 4B, when a cell reaches a PVFY level, a bit line voltage, e.g., a SSPC voltage, is applied to the bit line in order to slow programming of the cell until its Vt reaches the VFY level 425. The slowed programming can produce a relatively narrow Vt distribution by preventing the Vt of cells from reaching levels substantially over the VFY level 425. The slowed programming rate of a cell is represented by a reduction in DVt, e.g., a reduction in the amount of a cell's Vt shift. For instance, in FIG. 4A, the slowed programming of cell 404 is represented by "DVt=200*K with 0<K<1." That is, the Vt of cell 404 is increasing by less than it did prior to its Vt reaching the PVFY level, e.g., less than the Vstep voltage of 200 mV, in this example.

In FIG. 4A, the programming of the "Faster Cell+" 406 is not slowed because the Vt of the cell 406 shifts from a voltage level below PVFY 422 to a voltage level above VFY 425 after a next subsequent programming pulse 415. This can occur for cells such as cell 406 whose Vt shifts by an amount greater than the Vstep, e.g., a rate faster than 200 mV per pulse in this example. This rate can be represented by "DVt=200K with K>1" as shown in FIG. 4A. As shown in FIG. 4A, cell 406 has been programmed such that its Vt is substantially above VFY 425, which can result in overprogrammed cells and/or a wider than desirable Vt distribution for the particular program state.

As shown in FIGS. 4A and 4B, and as described above, once cells 402, 404, and 406 reach the VFY 425, an inhibit voltage, e.g., Vcc, is applied to the bit line to prevent further programming, e.g., Vt increases, of the cell. Thus, as shown in the middle graphs of FIGS. 4A and 4B, the increase of the Vt of each cell stops due to the end of the programming operation on that cell.

FIG. 4B illustrates the cells 402, 404, and 406 of FIG. 4A, after being programmed in accordance with a modulated selective slow programming convergence (MSSPC) method such as that described in connection with FIG. 3. As illustrated in FIG. 4B, the VFY 425 has a number of associated pre-verify levels PVFYp1, PVFYp2, . . . , PVFYpN such as described in connection with FIG. 2. VFY 425 can be the VFY associated with any number of states, e.g., one of VFY 225, 235, or 245 shown in FIG. 2. Similarly, PVFYp1, PVFYp2, PVFYpN can be respective PVFY levels 222-1 to 222-N, 232-1 to 232-N, and 242-1 to 242-N as shown in FIG. 2.

In FIG. 4B, the PVFY is increased on a pulse by pulse basis up to the uppermost PVFY. That is, PVFYp1 is the PVFY level to which the cell's Vt is compared after a first pulse, e.g., P1, PVFYp2 is the PVFY level to which the cell's Vt is compared after a second pulse, e.g., P2, PVFYpN is the PVFY level to which the cell's Vt is compared after an Nth pulse. In FIG. 4B, although the uppermost PVFY level PVFYpN is used after the third pulse, e.g., P3, embodiments are not so limited.

As illustrated in FIG. 4B, embodiments of the present disclosure can narrow Vt distributions and/or can prevent overprogramming caused by fast cells, e.g., 406. For instance, FIG. 4B illustrates that an adjusted PVFY level, e.g., a modulated PVFY level, can efficiently slow down the programming of fast cells such as cell 406.

FIG. 4B shows the Vt of cell 406 having reached a PVFY level, e.g., PVFYp1, after pulse P1. In contrast, the Vt of cell 406 does not reach the unmodulated PVFY level 422 shown in FIG. 4A after pulse P1. In response to the Vt of cell 406 reaching PVFYp1 after pulse P1, the bit line voltage VBL is changed from the programming bit line voltage, e.g., 0V, to the SSPC voltage. The programming rate change of cell 406 when its Vt reaches PVFYp1 can be represented by "DVt=200*K with 0<K<1" as shown in FIG. 4B. That is, in FIG. 4B, the Vt shift rate DVt for cell 406 changes from rate 409-1 (DVt=200*K with K>1) prior to the Vt reaching PVFYp1 to rate 409-2 (DVt=200*K with 0<K<1) in response to the Vt reaching PVFYp1. In other words, after the first pulse P1, the Vt shift of cell 406 is reduced from greater than Vstep, e.g., greater than 200 mV, to less than Vstep, e.g., less than 200 mV, such that the Vt shift of cell 406 is lowered for a number of subsequent pulses, e.g., P2, P3, P4, etc., until the Vt reaches the VFY level 425. In contrast, in FIG. 4A, the Vt shift of cell 406 remains greater than Vstep after pulse P1 and becomes overprogrammed, e.g., greater than VFY level 425, after pulse P2.

FIG. 5A illustrates a plot of programming pulses, memory cell Vt levels, and bit line voltages in accordance with a prior selective slow programming convergence method. The middle plot shown in FIGS. 5A and 5B illustrates a number of programming pulses including a number of programming pulses at an uppermost programming pulse voltage level, e.g., Vmax. Vmax can be a voltage of about 20V-22V, but embodiments are not limited to a particular Vmax level.

The upper plot shown in FIG. 5A shows the Vt for a slow cell 502 after each of the number of programming pulses. When the programming pulse voltage level approaches and/or has reached the uppermost level Vmax, the Vt of slow cells, e.g., cell 502, may tend to shift more slowly. For instance, the Vt shift of the slow cells, e.g., cell 502, may be substantially less than the programming pulse step level. As an example, if the programming pulse step level is 200 mV, the Vt shift for slow cells when the programming pulse voltage level reaches Vmax can be 50 mV or less. The reduced Vt shift of such slow cells can reduce programming throughput since more pulses can be required for the Vt to reach the VFY level, e.g., a programmed level such as VFY 225, 235, and 245 shown in FIG. 2.

The lower plot in FIG. 5A shows an SSPC voltage to be applied to bit lines coupled to memory cells whose Vt has reached the PVFY level. The PVFY level shown in FIGS. 5A and 5B can be an uppermost PVFY level, e.g., PVFYpN, of a modulated PVFY such as that described above. For instance, depending on the state to which the cell 502 is being programmed, the PVFY shown in FIGS. 5A and 5B can be PVFYpN 222-N, 232-N, or 242-N.

As noted above, the Vt of slow cells can shift more slowly as a number of programming pulses having the Vmax level are applied thereto. The slowed Vt shift can result in lower throughput as an increased number of pulses are required for the Vt of such cells to reach the proper VFY. In such cases, applying the SSPC voltage to bit lines coupled to slow cells in response to their Vt reaching the PVFY level can further reduce programming throughput as the Vt shift becomes even further reduced. The above described effect can be seen in FIG. 5A as the Vt of slow cell 502 increases at a slower rate after its Vt reaches the PVFY level.

FIG. 5B illustrates a plot of programming pulses, memory cell Vt levels, and bit line voltages in accordance with a modulated selective slow programming convergence method such as that illustrated in FIG. 3. FIG. 5B shows the Vt of the slow cells 502 of FIG. 5A after being programmed according to the modulated selective slow programming convergence method of FIG. 3. As described above in connection with FIG. 3, in various embodiments of the present disclosure, the SSPC voltage can be a modulated SSPC voltage, e.g., MSSPC as shown in FIG. 5B.

In various embodiments, and as shown in FIG. 5B, the modulated SSPC voltage is decreased from an uppermost SSPC voltage to a lowermost SSPC voltage over a number of programming pulses. The uppermost SSPC voltage voltage can be various voltage levels below the inhibit voltage, e.g., Vcc, and above the programming bit line voltage, e.g., 0V. The lowermost SSPC voltage can be various voltage levels below the uppermost voltage level. As an example, the modulated SSPC voltage can be decremented from about 0.6V to 0V over a number of programming pulses. In some embodiments, a PVFY level is not used for verification operations after the modulated SSPC voltage has been decremented to the programming bit line voltage, e.g., 0V in this example. In such embodiments, the Vt of those cells whose Vt has not reached the PVFY level is no longer compared to a PVFY level. No longer comparing the cell Vt to a PVFY level, e.g., removing the PVFY from verification operations, can improve throughput since the cell's Vt is compared only to the VFY level if the PVFY is removed.

In various embodiments, the SSPC voltage is maintained as an unmodulated voltage until the uppermost programming pulse voltage, e.g., Vmax, is reached. That is, the bias voltage applied to bit lines in response to the Vt of cells coupled thereto reaching the PVFY level, can remain at a voltage, e.g., 0.6V, until the programming pulse voltage has reached Vmax. Maintaining the SSPC voltage as an unmodulated voltage for a number of programming pulses, e.g., a number of initial incremented pulses, can create narrow Vt distributions by slowing the Vt increase rate of fast cells that reach a PVFY level and can improve throughput by reducing and/or eliminating the effect of the SSPC voltage for slow cells.

For instance, in comparing the slow cell 502 of FIGS. 5A and 5B, it is observed that the modulated selective slow programming convergence method used in programming slow cell 502 in FIG. 5B causes the slow cell 502 to reach the VFY level faster than the method used to program slow cell 502 in FIG. 5A.

Figure 6:
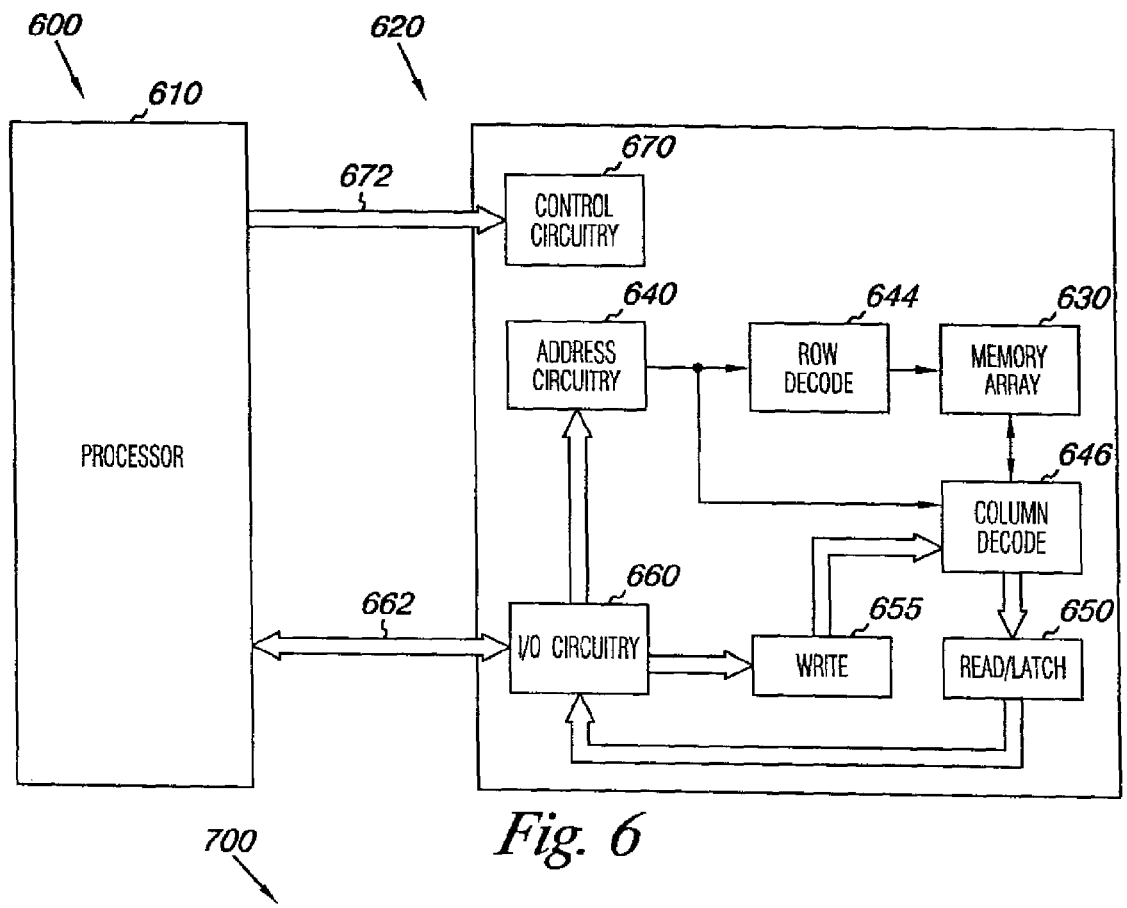
FIG. 6 is a functional block diagram of an electronic memory system having at least one memory device in accordance with an embodiment of the present disclosure.

FIG. 6 is a functional block diagram of an electronic memory system 600 having at least one memory device 620 in accordance with an embodiment of the present disclosure. Memory system 600 includes a processor 610 coupled to a non-volatile memory device 620 that includes a memory array 630 of non-volatile cells. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

For clarity, the electronic memory system 600 has been simplified to focus on features with particular relevance to the present disclosure. The memory device 620 includes an array of non-volatile memory cells 630, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 6 includes address circuitry 640 to latch address signals provided over I/O connections 662 through I/O circuitry 660. Address signals are received and decoded by a row decoder 644 and a column decoder 646 to access the memory array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The memory array 630 of non-volatile cells can include non-volatile multilevel memory cells programmed according to embodiments described herein. The memory device 620 reads data in the memory array 630 by sensing voltage and/or current changes in the memory array columns using sense/buffer circuitry that in this embodiment can be read/latch circuitry 650. The read/latch circuitry 650 can be coupled to read and latch a row of data from the memory array 630. I/O circuitry 660 is included for bi-directional data communication over the I/O connections 662 with the processor 610. Write circuitry 655 is included to write data to the memory array 630.

Control circuitry 670 decodes signals provided by control connections 672 from the processor 610. These signals can include chip signals, write enable signals, and address latch signals that are used to control the operations on the memory array 630, including data read, data write, and data erase operations. In various embodiments, the control circuitry 670 is responsible for executing instructions from the processor 610 to perform the operating and programming embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
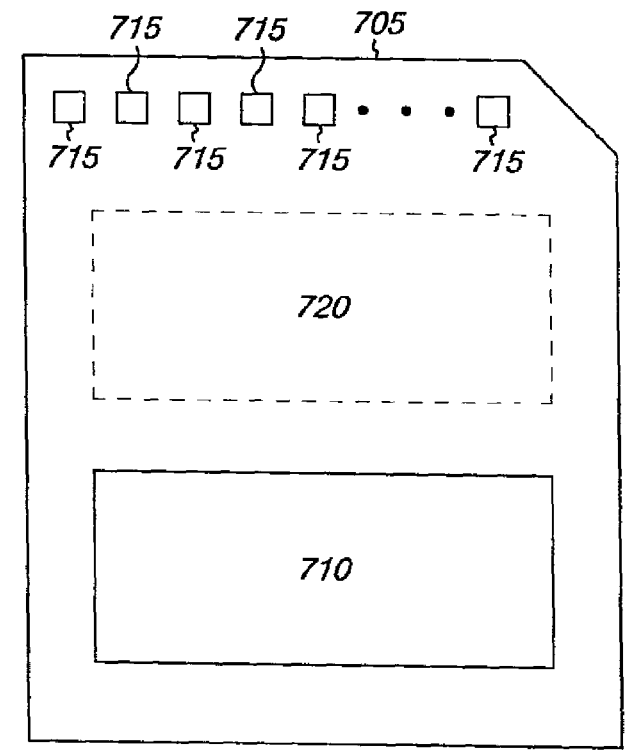
FIG. 7 is a functional block diagram of a memory module having at least one memory device in accordance with an embodiment of the present disclosure.

FIG. 7 is a functional block diagram of a memory module 700 having at least one memory device 710 in accordance with an embodiment of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 includes an array of non-volatile multilevel memory cells programmed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Embodiments for programming non-volatile multilevel memory cells have been described. Various embodiments for improved widths of Vt distributions while maintaining or improving programming throughput. One embodiment accomplishes this by determining whether the Vt of each of the cells has reached a pre-verify voltage (PVFY) associated with the program state, selectively biasing bit lines coupled to those cells whose Vt has reached the PVFY, adjusting the PVFY to a different level, and selectively biasing bit lines coupled to cells whose Vt has reached the adjusted PVFY, wherein the PVFY and the adjusted PVFY are less than the VFY.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for programming a memory cell, the method comprising:
    determining whether a threshold voltage of the cell has reached a pre-verify (PVFY) voltage associated with a desired program state;

biasing the cell to slow a rate of programming of the cell responsive to the threshold voltage reaching the PVFY voltage;

adjusting the PVFY voltage to a different level responsive to the threshold voltage of the cell not reaching the PVFY voltage; and applying a programming pulse to the cell.

2. The method of claim 1, wherein biasing the cell to slow a rate of programming comprises biasing a bit line coupled to the cell with a selective slow programming convergence (SSPC) voltage.

3. The method of claim 1, wherein the adjusting is done after each of a number of programming pulses if the threshold voltage of the cell does not reach a respective PVFY level associated with a respective one of the number of programming pulses.

4. The method of claim 1, wherein the adjusting is performed on a programming pulse by programming pulse basis.

5. The method of claim 1, wherein the level of the PVFY voltage varies over a number of programming pulses.

6. The method of claim 1, wherein adjusting the PVFY voltage to a different level comprises adjusting the PVYF voltage to a different level if a number of programming pulses has not reached a threshold level.

7. The method of claim 1, wherein adjusting the PVFY voltage to a different level comprises adjusting the PVFY voltage to a different level until an uppermost PVFY level is reached.

8. The method of claim 1, Wherein adjusting comprises uniformly incrementing the PVFY voltage to a different level.

9. The method of claim 1, wherein adjusting the PVFY voltage to a different level comprises increasing the PVFY voltage to a different level.

10. A method for programming a memory cell, the method comprising:

determining whether a threshold voltage of the cell has reached a pre-verify (PVFY) voltage associated with a desired program state;

biasing the cell to slow a rate of programming of the cell responsive to the threshold voltage reaching the PVFY voltage;

applying a programming pulse to the cell; and adjusting the biasing of the cell responsive to reaching a threshold associated with the programming pulse.

11. The method of claim 10, wherein the threshold comprises a threshold number of programming pulses.

12. The method of claim 11, wherein the threshold number comprises a number of initial incremented pulses.

13. The method of claim 10, wherein the threshold comprises a threshold programming pulse voltage level.

14. The method of claim 13, wherein the threshold programming pulse voltage level is an uppermost programming pulse voltage level.

15. The method of claim 10, wherein biasing the cell comprises biasing a bit line coupled to the cell with a selective slow programming convergence (SSPC) voltage and wherein adjusting the biasing comprises adjusting the SSPC voltage level.

16. The method of claim 15, wherein adjusting the SSPC voltage level comprises modulating the SSPC voltage level.

17. The method of claim 15, wherein adjusting the SSPC voltage level comprises decreasing the SSPC voltage level.

18. The method of claim 17, wherein decreasing the SSPC voltage level comprises decreasing the SSPC voltage level over a number of subsequent programming pulses.

19. The method of claim 10, further comprising determining whether the threshold voltage of the cell has reached the PVFY voltage before and after adjusting the biasing of the cell.

20. The method of claim 10, further comprising maintaining the biasing until reaching the threshold.

21. The method of claim 10, wherein the adjusting is performed responsive to a determination that the threshold voltage has not reached a verify (VFY) voltage associated with the desired program state after applying the programming pulse.

22. The method of claim 17, further comprising not performing the determining act after the SSPC voltage level has been decreased to a programming bit line voltage.

23. A memory device, comprising:

an array of memory cells; and control circuitry configured to:

determine whether a threshold voltage of the cell has reached a pre-verify (PVFY) voltage associated with a desired program state in response to a programming pulse applied to the cell;

bias the cell to slow a rate of programming of the cell responsive to the threshold voltage reaching the PVFY voltage;

adjust the PVFY voltage to a different level responsive to the threshold voltage of the cell not reaching the PVFY voltage; and apply a subsequent programming pulse to the cell.

24. The memory device of claim 23, wherein:

biasing the cell to slow a rate of programming comprises biasing a bit line coupled to the cell with a selective slow programming convergence (SSPC) voltage; and adjusting is done after each of a number of subsequent programming pulses if the threshold voltage of the cell does not reach a respective PVFY level associated with a respective one of the number of programming pulses.

25. The memory device of claim 23, wherein the adjusting of the PVFY voltage to a different level is performed on a programming pulse by programming pulse basis.

26. The memory device of claim 23, wherein the adjusting of the PVFY voltage to a different level comprises adjusting the PVYF voltage to a different level if the programming pulse has not reached a threshold level.

27. A memory device, comprising:

an array of memory cells; and control circuitry configured to:

determine whether a threshold voltage of the cell has reached a pre-verify (PVFY) voltage associated with a desired program state in response to a programming pulse applied to the cell;

bias the cell to slow a rate of programming of the cell responsive to the threshold voltage reaching the PVFY voltage in response to the programming pulse applied to the cell;

apply a subsequent programming pulse to the cell; and adjust the biasing of the cell responsive to reaching a threshold associated with the subsequent programming pulse.

28. The memory device of claim 27, wherein the control circuitry is configured to:

bias a bit line coupled to the cell to slow the rate of programming of the cell responsive to the threshold voltage reaching the PVFY voltage in response to the programming pulse applied to the cell;

bias the bit line coupled to cell to increase the rate of programming of the cell responsive to the subsequent programming pulse applied to the cell.

29. The memory device of claim 28, wherein increasing the rate of programming of the cell responsive to the subsequent programming pulse includes decreasing a selective slow programming convergence (SSPC) voltage level applied to the bit line.

30. The memory device of claim 29, wherein decreasing the SSPC voltage level comprises decreasing the SSPC voltage level over a number of subsequent programming pulses.

* * * * *

UNITED STATES PATENT AND TRADEMARK OFFICE
CERTIFICATE OF CORRECTION

PATENT NO.       : 7,944,757 B2                           Page 1 of 1
APPLICATION NO.  : 12/718290
DATED            : May 17, 2011
INVENTOR(S)      : Violante Moschiano et al.

It is certified that error appears in the above-identified patent and that said Letters Patent is hereby corrected as shown below:

In column 15, line 23, in claim 6, delete "PVYF" and insert -- PVFY --, therefor.

In column 15, line 30, in claim 8, delete "Wherein" and insert -- wherein --, therefor.

In column 16, line 42, in claim 26, delete "PVYF" and insert -- PVFY --, therefor.

Signed and Sealed this
Twelfth Day of July, 2011

David J. Kappos
*Director of the United States Patent and Trademark Office*